June 30, 1970 E. COTTATELLUCCI 3,518,575

FREQUENCY MODULATOR WITH TRANSISTOR MULTIVIBRATOR

Filed July 27, 1967

Ezio Cottatellucci
INVENTOR.

BY

Karl F. Ross
Attorney 3,518,575

FREQUENCY MODULATOR WITH TRANSISTOR MULTIVIBRATOR

Ezio Cottatellucci, Milan, Italy, assignor to Societa Italiana Telecomunicazioni Siemens S.p.A., Milan, Italy, a corporation of Italy Filed July 27, 1967, Ser. No. 656,406
Claims priority, application Italy, Aug. 26, 1966, 19,622/66
Int. Cl. H03k 3/282, 3/08
U.S. Cl. 332—14 9 Claims

ABSTRACT OF THE DISCLOSURE

Frequency modulator having alternately conductive stages of a transistor multivibrator connected in series with respective constant-current devices, preferably also transistors, whose conductivity is controlled by an applied biasing voltage, the emitters of the two multivibrator stages being interconnected through a condenser whose charging voltage triggers the switchover of the multivibrator upon attainment of a predetermined level of either polarity.

My present invention relates to a linearly controllable frequency modulator of the multivibrator type.

The general object of my invention is to provide a frequency modulator using a transistor multivibrator which may be linearly controlled by an input voltage over a wide range of frequencies and whose output has a virtually invariable waveshape and, preferably, a constant amplitude over its entire frequency range.

Generally, astable transistor multivibrators have a period which depends on the exponential charge and/or discharge of a storage element, such as a condenser. A reasonably linear frequency control of such multivibrators may be achieved only over a narrow range if the storage element is charged through a variable passive impedance or through an ordinary variable-gain amplifier. In the modulator according to my invention a capacitor (or group of capacitors) connected across the input electrodes of two multivibrator stages is linearly charged with alternating polarity by way of a pair of voltage-controlled constant-current devices, advantageously transistors, having the same modulating voltage applied thereto; with the switchover rate of the multivibrator high compared to the maximum frequency of the modulating input signal, there results a square-wave output voltage whose waveshape is independent of the instantaneous signal level. Thus, the positive and negative portions of the multivibrator output cycle have a fixed time ratio (possibly 1:1) determined by the impedance ratio of the two current paths through the aforementioned constant-current devices. With application of a clamping voltage to a control electrode of one of the multivibrator stages in the conductive condition thereof, one output terminal of the multivibrator has an output whose amplitude swing remains constant for all modulating voltages.

The invention will be described in greater detail with reference to the accompanying drawing in which.

Figure 1:
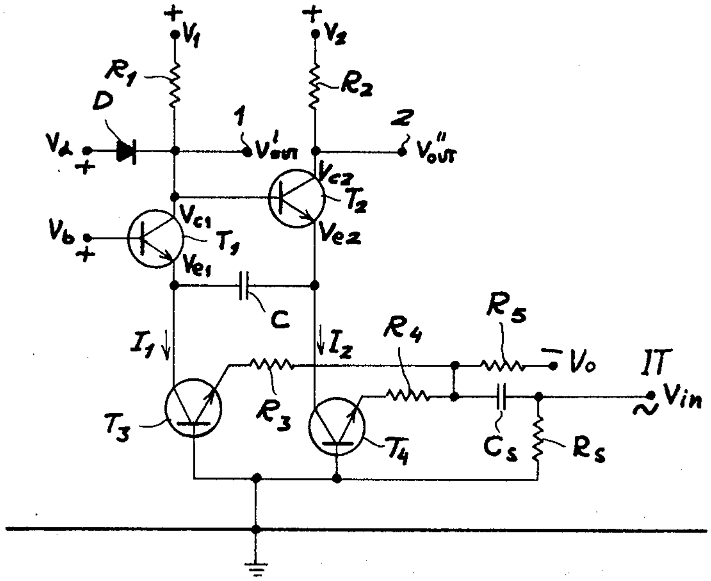
FIG. 1 is a circuit diagram of a modulator according to my invention.

In FIG. 1 a pair of transistors $T_3$ and $T_4$, shown to be of the NPN type, represent two voltage-controlled constant-current devices. The bases of transistors $T_3$ and $T_4$ are grounded. Two series-connected resistors $R_3$ and $R_4$ connect the emitters of transistors $T_3$ and $T_4$ to a point of fixed biasing voltage $V_0$ in series with a common further resistor $R_5$. A modulating input voltage $V_{in}$, developed across a grounded resistor $R_5$, is applied via an input terminal $I_T$ to the junction of resistors $R_3$, $R_4$ and $R_5$ through a coupling condenser $C_s$ of large capacitance. The collectors of transistors $T_3$ and $T_4$, carrying currents $I_1$ and $I_2$ of a magnitude dependent on the input signal $V_{in}$, are connected to respective emitters of another pair of transistors $T_1$ and $T_2$, also of the NPN type, which form respective stages of an astable multivibrator. A switching capacitor C is connected across the emitters of transistors $T_1$ and $T_2$. The base of transistor $T_1$ is connected to a source of fixed biasing voltage $V_b$; the base of transistor $T_2$ and the collector of transistor $T_1$ are tied together and connected to a source of positive driving voltage $V_1$ through a resistor $R_1$ and to a source of somewhat lower clamping voltage $V_d$ through a diode D so poled as to be reverse-biased by the potential difference $V_1$–$V_d$ when the transistor $T_1$ is cut off. A source of positive driving voltage $V_2$, higher than $V_1$, is connected to the collector of transistor $T_2$ by way of a resistor $R_2$ .Output terminals 1 and 2 are tied to the collectors of multivibrator stages $T_1$ and $T_2$, respectively.

Figure 2:
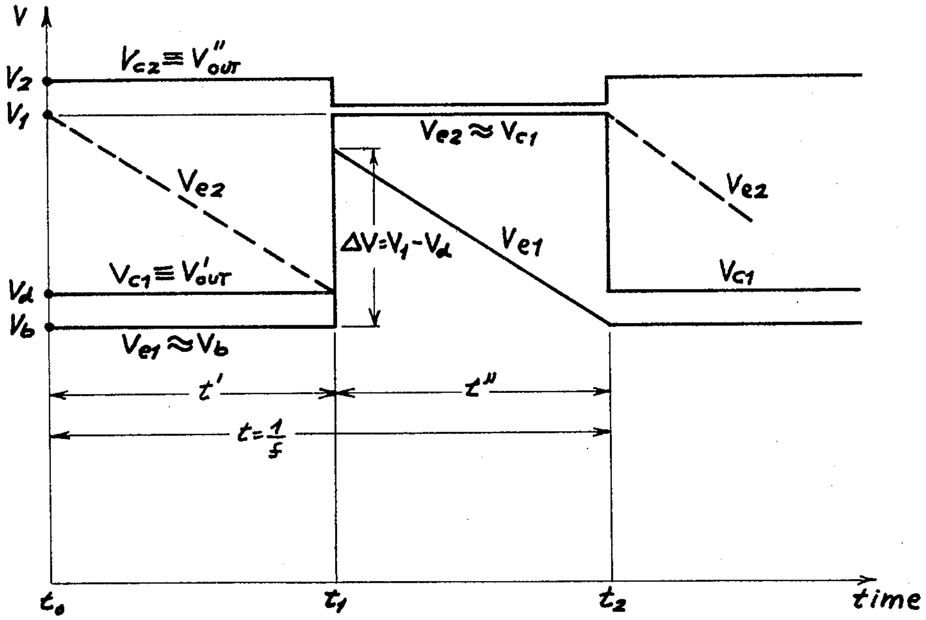
FIG. 2 is a diagrammatic representation of the waveforms associated with the modulator of FIG. 1.

In FIG. 2 the variations of the emitter and collector voltages $V_{e1}$, $V_{e2}$ and $V_{c1}$, $V_{c2}$ of transistors $T_1$, $T_2$ have been plotted, together with the fixed voltages $V_1$, $V_2$, $V_b$ and $V_d$, during one cycle of the multivibrator. The cycle has a length $t$ equal to the sum of the intervals $t'$ and $t''$ during which the transistors $T_1$ and $T_2$ are respectively conductive.

During the operation of the multivibrator $T_1$, $T_2$ the capacitor C is charged in one sense or the other, depending on which of its stages is conductive. At instant $t_o$, the polarity of the charge is such that voltage $V_{e2}$ is positive with respect to voltage $V_{e1}$. With transistor $T_1$ turned on and transistor $T_2$ cut off, the emitter current of transistor $T_1$ splits into a branch $I_1$ passing through transistor $T_3$ and a branch $I_2$ which flows through transistor $T_4$ in series with capacitor C, thereby charging this capacitor in the reverse sense at a uniform rate. Throughout the interval $t'$ the voltage $V_{e2}$ drops at a constant rate determined by the current $I_2$ until, at a time $t_1$, it becomes slightly less than the voltage $V_{c1}$ and trips transistor $T_2$ into conduction. This operation drives the emitter of transistor $T_2$ more positive and, through condenser C, applies a positive switching pulse to the emitter of transistor $T_1$ which is thereby cut off while its collector potential $V_{c1}$ jumps from the clamping voltage $V_d$ to the driving voltage $V_1$. During the ensuing interval $t''$, the emitter current of transistor $T_2$ splits into a branch $I_2$, passing through the transistor $T_4$, and a branch $I_1$ which traverses the transistor $T_3$ in series with a capacitor C, thereby linearly charging this capacitor in the original sense to restore, at time $t_2$, the condition existing at time $t_o$, i.e. at the beginning of the cycle.

The operating period $t=1/f$ ($f$ being the output frequency) is directly related to the time necessary to charge the capacitor C to a level corresponding to either the clamping voltage $V_d$ (interval $t'$) or the biasing voltage $V_b$ (interval $t''$), the jump in emitter voltage having the same invariable magnitude $\Delta V=V_1-V_d$ during each switchover. The magnitude of the charging currents $I_1$, $I_2$, and therefore the duration of charging intervals $t''$ and $t'$, is a function of the applied signal voltage $V_{in}$. The output voltage $V'_{out}$ at terminal 1 varies between the supply voltage $V_1$ and the clamping voltage $V_d$, independently of frequency, and is therefore always equal to $\Delta V$. At terminal 2 the voltage $V''_{out}$ rises to a maximum of $V_2$ when transistor $T_2$ is cut off, but its minimum value depends on the voltage drop across resistor $R_2$ during conduction of that stage which in turn is determined by the magnitude of the currents $I_1$ and $I_2$. During negative half-cycles of the input signal $V_{in}$ the currents $I_1$ and $I_2$ are relatively high, causing a greater voltage drop across resistor $R_2$ upon conduction of transistor $T_2$ along with a higher operating frequency $f$; during positive half-cycles the charging currents are relatively low, the frequency drops and the voltage swing on terminal $V''_{out}$ is reduced.

The clamping circuit including voltage source $V_d$ and diode D can be omitted if the parameters of the system are so chosen that transistor $T_1$ invariably saturates during cutoff of transistor $T_2$, irrespectively of the amplitude of the applied modulating voltage $V_{in}$. In that case the terminal voltage $V'_{out}$ will vary between $V_1$ and $(V_1-R_1I_{sat})$, $I_{sat}$ being the saturation current of stage $T_1$; the operating frequency $f$ will then be determined exclusively by the magnitude of $I_1$ during charging period $t''$ in which the nonsaturating transistor $T_2$ conducts.

I claim:

1. A frequency modulator comprising an astable multivibrator with two stages interconnected for alternate conduction and provided with respective input electrodes; a first and a second constant-current device respectively connected in series with said stages and provided each with a respective control electrode; condenser means connected between said input electrodes for triggering a switchover between said stages upon attainment by said condenser means of a charging voltage of predetermined magnitude of either polarity; and a common control circuit for said stages including an input terminal connected in parallel to the control electrodes of said constant-current devices for varying their conductivity in response to an input signal applied to said terminal, thereby altering the length of an operating cycle of said multivibrator.

2. A frequency modulator as defined in claim 1 wherein said stages are a first and a second transistor, said input electrodes being emitters of said transistors.

3. A frequency modulator as defined in claim 2 wherein said constant-current devices are a third and a fourth transistor.

4. A frequency modulator as defined in claim 3 wherein said third and fourth transistors have emitters connected in parallel, as said control electrodes, in said common circuit.

5. A frequency modulator as defined in claim 4 wherein said first transistor has a collector connected to a source of a first fixed driving voltage through a first resistor, said second transistor having a collector connected to a source of a second fixed driving voltage through a second resistor, said first transistor having a base connected to a source of fixed biasing potential, said second transistor having a base connected to the collector of said first transistor.

6. A frequency modulator as defined in claim 5, further comprising diode means for connecting the collector of said first transistor to a source of fixed clamping potential in the conductive condition of said first transistor.

7. A frequency modulator as defined in claim 5, further comprising an output lead connected to the collector of said first transistor.

8. A frequency modulator as defined in claim 4, further comprising a third and a fourth resistor connected between the emitters of said third and fourth transistors, respectively, and said common circuit.

9. A frequency modulator as defined in claim 8 wherein said common circuit includes a further resistor in series with a source of constant voltage, said terminal being capacitively connected to a common junction of said third, fourth and further resistors.

References Cited

UNITED STATES PATENTS

| | | | |
|---|---|---|---|
| 2,787,712 | 4/1957 | Priebe et al. | 331—145 X |
| 3,010,078 | 11/1961 | Stefanob | 331—113 X |
| 3,371,289 | 2/1968 | Luna et al. | 332—14 |
| 3,425,000 | 1/1969 | Dann | 332—14 X |

ALFRED L. BRODY, Primary Examiner

U.S. Cl. X.R.

307—290; 331—113, 144; 332—16